(12) United States Patent
Wen

(10) Patent No.: US 11,735,229 B2
(45) Date of Patent: Aug. 22, 2023

(54) MULTI-DIE STACKED PACKAGE MEMORY AND OUTPUT SYNCHRONIZATION METHOD THEREOF

(71) Applicant: XTX Technology Inc., Guangdong (CN)

(72) Inventor: KK Wen, Guangdong (CN)

(73) Assignee: XTX Technology Inc., Shenzhen (CN)

( * ) Notice: Subject to any disclaimer, the term of this patent is extended or adjusted under 35 U.S.C. 154(b) by 228 days.

(21) Appl. No.: 17/296,974

(22) PCT Filed: Nov. 11, 2020

(86) PCT No.: PCT/CN2020/128133
§ 371 (c)(1),
(2) Date: May 25, 2021

(87) PCT Pub. No.: WO2021/135660
PCT Pub. Date: Jul. 8, 2021

(65) Prior Publication Data
US 2022/0310131 A1   Sep. 29, 2022

(30) Foreign Application Priority Data

Dec. 30, 2019   (CN) .......................... 201911389198.6

(51) Int. Cl.
*G11C 5/02*   (2006.01)
*G11C 7/10*   (2006.01)
(52) U.S. Cl.
CPC .............. *G11C 5/02* (2013.01); *G11C 7/1066* (2013.01); *G11C 2207/105* (2013.01)

(58) Field of Classification Search
CPC ..... G11C 5/04; G11C 5/066; G11C 2207/105; G11C 7/1063; G11C 8/12;
(Continued)

(56) References Cited

U.S. PATENT DOCUMENTS 9,786,332 B2 * 10/2017 Cyr ..................... H01L 25/0657
2003/0021139 A1   1/2003 Nakamura et al.
(Continued)

FOREIGN PATENT DOCUMENTS

CN   103280444 A   9/2013

OTHER PUBLICATIONS

Extended European Search Report of counterpart European Patent Application No. 20897636.5 dated Jan. 24, 2022.

*Primary Examiner* — Thong Q Le

(57) ABSTRACT

The invention provides a multi-die stacked package memory and an output synchronization method thereof. The multi-die stacked package memory includes multiple dies (100), and the multiple dies (100) are stacked and packaged together to form a stacked package structure. The multiple dies (100) share a CS #pin, and the CS #pin is configured to turn on or turn off the stacked package structure. The multiple dies (100) also share an IO pin. Each die (100) is provided with a SYNC_PAD pin. The SYNC_PAD pins of the multiple dies (100) are electrically connected together, the SYNC_PAD pins are configured to judge whether the multiple dies (100) are all in an idle status or not. The multi-die stacked package memory and the output synchronization method thereof are simple in structure, easy to realize, stable and reliable.

3 Claims, 3 Drawing Sheets

(58) Field of Classification Search
CPC ..... G11C 2207/108; G11C 5/02; G11C 5/025; G11C 7/065; G11C 7/1066; G11C 7/22; G11C 11/408; G11C 2207/2281; G11C 2207/229; G11C 7/1015; G11C 7/1072; G11C 7/222; G11C 5/06; G11C 7/1006; G11C 7/1045; G11C 29/781; G11C 5/063; G11C 7/10; H01L 2924/1434; H01L 2224/131; H01L 2224/16227; H01L 2224/2919; H01L 2224/32225; H01L 2224/48227; H01L 23/5252; H01L 23/5256; H01L 24/13; H01L 24/16; H01L 24/29; H01L 24/32; H01L 24/48; H01L 25/0655; H01L 25/50; H01L 2924/00014; H01L 2924/014; H01L 2225/06506; H01L 2225/0651; H01L 2225/06562; H01L 2225/06582; H01L 25/0657; H01L 25/18; H01L 2924/1431; G06F 13/4018; G06F 13/4234
USPC ...... 365/230.03, 63, 189.02, 189.11, 189.04, 365/230.01, 230.02, 51, 189.05, 226, 52
See application file for complete search history.

(56) References Cited

U.S. PATENT DOCUMENTS

| | | |
|---|---|---|
| 2011/0249512 A1 | 10/2011 | Mochizuki et al. |
| 2012/0182780 A1 | 7/2012 | Cheng |
| 2014/0195734 A1 | 7/2014 | Ha et al. |

* cited by examiner

MULTI-DIE STACKED PACKAGE MEMORY AND OUTPUT SYNCHRONIZATION METHOD THEREOF

TECHNICAL FIELD

The invention relates to the technical field of memories, in particular to a multi-die stacked package memory and an output synchronization method thereof.

BACKGROUND ART

As the die integration of memories is higher and higher, higher requirements for the packaging of peripheral components are also put forward, which leads to the technology of multi-die stacked packaging.

At present, there are mainly three types of technologies for multi-die stacked packaging for memories:

Firstly, multiple dies are stacked and packaged together, and the multiple dies use various chip selection signals. A host selects different dies through different chip selection signals for operation and access. As shown in FIG. 1, the FIG. 1 is a schematic diagram of a stacked package structure of one embodiment of the multiple dies using various chip selection signals. The die Die 0 #and the die Die 1 #are stacked and packaged together. The die Die 0 #is provided with a pin CS0 #, and the die Die 1 #is provided with a pin CS1 #. The host operates and accesses the die Die 0 #from the pin CS0 #through the chip selection signal corresponding to the die Die 0 #, and the host operates and accesses the die Die 1 #from the pin CS1 #through the chip selection signal corresponding to die Die 1 #.

Secondly, multiple dies are stacked and packaged together, and the multiple dies use the same chip selection signal. The host selects different dies for operation and access by sending an instruction of selecting different dies. As shown in FIG. 2, the FIG. 2 is a schematic diagram of a stacked package structure of one embodiment of the multiple dies using the same chip selection signal. The die Die 0 #and the die Die 1 #are stacked and packaged together. The die Die 0 #and the die Die 1 #share the same pin CS #. The host operates and accesses the die Die 0 #from the pin CS #through an instruction of selecting the die Die 0 #, and the host operates and accesses the die Die 1 #from the pin CS #through an instruction of selecting the die Die 1 #.

Thirdly, multiple dies are stacked and packaged together, and the multiple dies use the same chip selection signal. The host operates and accesses the multiple dies as the same die, and no obvious difference exists in user experience compared with a single high-capacity memory die.

The above memory using either the first or second multi-die stacked packaging technology has higher requirements on the host and is incompatible with the single high-capacity memory die, while the memory using the third multi-die stacked packaging technology has higher requirements on multi-die output synchronization. Particularly, if multiple dies stacked and packaged together are subjected to the same operation, the host judges whether the operation is completed or not by accessing the values of status registers, since the performance of each die cannot be guaranteed to be the same, the working efficiencies of the multiple dies are different, at the same time, the status register corresponding to the die with higher working efficiency is reset, and the status register corresponding to the die with lower working efficiency is still in the working status and is not reset. If the multiple dies are not subjected to output synchronization, the phenomenon of output contradiction (i.e., the same IO outputs high level and low level respectively, and a short circuit is produced between a power supply and ground) will exist, so that the die function is abnormal, and even the dies are burnt out.

SUMMARY OF THE INVENTION

In view of the above technical problems, the invention provides a multi-die stacked package memory and an output synchronization method thereof.

The technical solutions provided by the invention are as follows:

The invention provides a multi-die stacked package memory comprising multiple dies. The multiple dies are stacked and packaged together to form a stacked package structure. The multiple dies share a CS #pin, and the CS #pin is configured to turn on or turn off the stacked package structure. The multiple dies also share an IO pin. The IO pin is configured to allow the stacked package structure to output a busy status signal or an idle status signal. Each die is provided with a SYNC_PAD pin.

The SYNC_PAD pins of the multiple dies are electrically connected together. The SYNC_PAD pins are configured to judge whether the multiple dies are all in an idle status or not. If yes, the stacked package structure is controlled to output the idle status signal through the IO pin, and if not, the stacked package structure is controlled to output the busy status signal through the IO pin.

In the multi-die stacked package memory, each die comprises a transistor. A source electrode of the transistor is grounded. A drain electrode of the transistor is electrically connected with the SYNC_PAD pin of the die. The drain electrode of the transistor is also connected with a pull-up resistance circuit and the IO pin. A grid electrode of the transistor of the die is configured to obtain switching signals representing a working status of the die and turning on or turning off the die according to the working status of the die. The working status of the die comprises the idle status or a busy status.

In the multi-die stacked package memory, the pull-up resistance circuit comprises a pull-up resistor and a power end. The drain electrode of the transistor of the die is connected with the power end through the pull-up resistor.

The invention also provides an output synchronization method of a multi-die stacked package memory. The method comprises the following steps:

S1. providing the multi-die stacked package memory, wherein the multi-die stacked package memory comprises multiple dies, the multiple dies are stacked and packaged together to form a stacked package structure, the multiple dies share a CS #pin, the CS #pin is configured to turn on or turn off the stacked package structure, the multiple dies also share an IO pin, the IO pin is configured to allow the stacked package structure to output a busy status signal or an idle status signal, and each die is provided with a SYNC_PAD pin;

S2. electrically connecting the SYNC_PAD pins of the multiple dies together, wherein the SYNC_PAD pins are configured to judge whether the multiple dies are all in an idle status or not; if yes, controlling the stacked package structure to output the idle status signal through the IO pin; and if not, controlling the stacked package structure to output the busy status signal through the IO pin.

In the above-mentioned output synchronization method of the invention, in the step S1, each die comprises a transistor. A source electrode of the transistor is grounded. A drain electrode of the transistor is electrically connected with the SYNC_PAD pin of the die. The drain electrode of the transistor is also connected with a pull-up resistance circuit and the IO pin. A grid electrode of the transistor of the die is configured to obtain switching signals representing a working status of the die and turning on or turning off the die according to the working status of the die. The working status of the die comprises the idle status or a busy status.

In the above-mentioned output synchronization method of the invention, the pull-up resistance circuit comprises a pull-up resistor and a power end. The drain electrode of the transistor of the die is connected with the power end through the pull-up resistor.

The multi-die stacked package memory and the output synchronization method thereof of the invention achieve the effect of output synchronization by utilizing the characteristic that open-drain structures do not conflict, the circuit structure is simple, the implementation is easy, and stability and reliability are achieved.

BRIEF DESCRIPTION OF THE DRAWINGS

The following will further describe the invention with reference to accompanying drawings and embodiments. In the accompanying drawings.

DETAILED DESCRIPTION OF THE INVENTION

To describe the technical objectives, technical solutions and technical effects of the invention more clearly so as to facilitate the technical personnel in the field to understand and implement the invention, the following will further describe the invention in detail with reference to the accompanying drawings and the specific embodiments.

Figure 1:
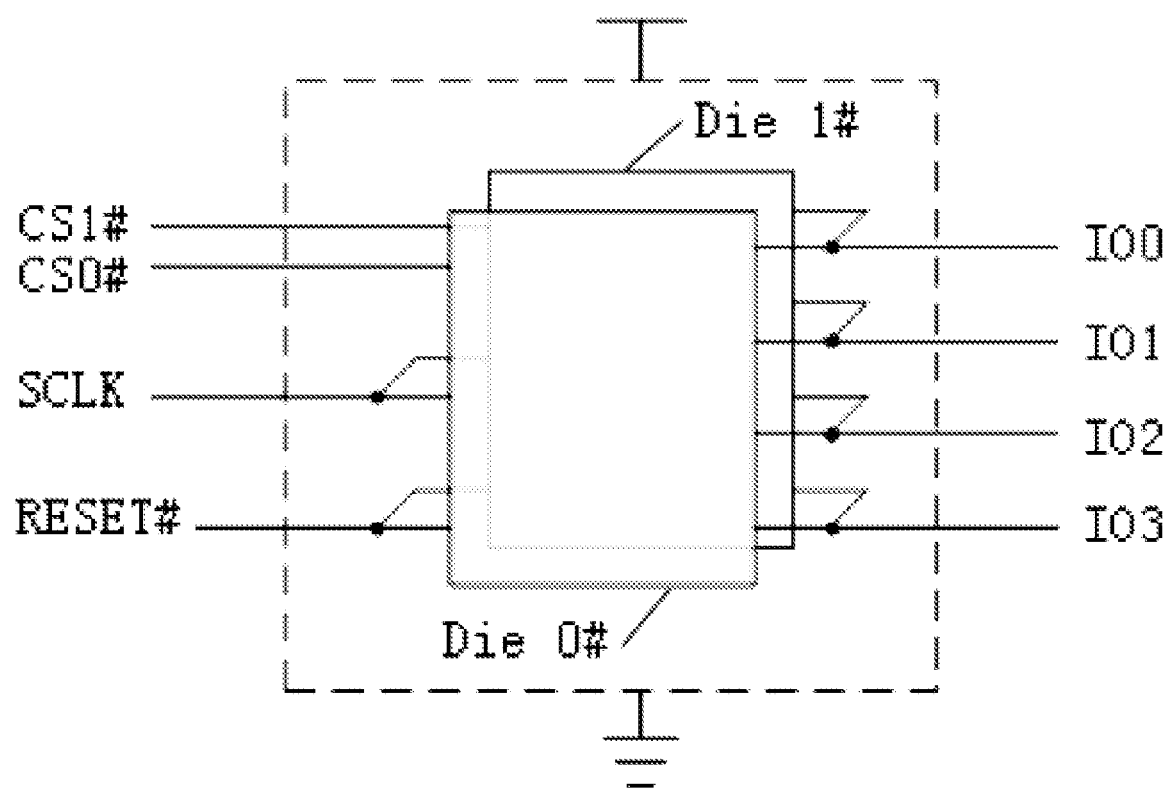
FIG. 1 is a schematic diagram of a stacked package structure of an embodiment of multiple dies using various die selection signals.
Figure 2:
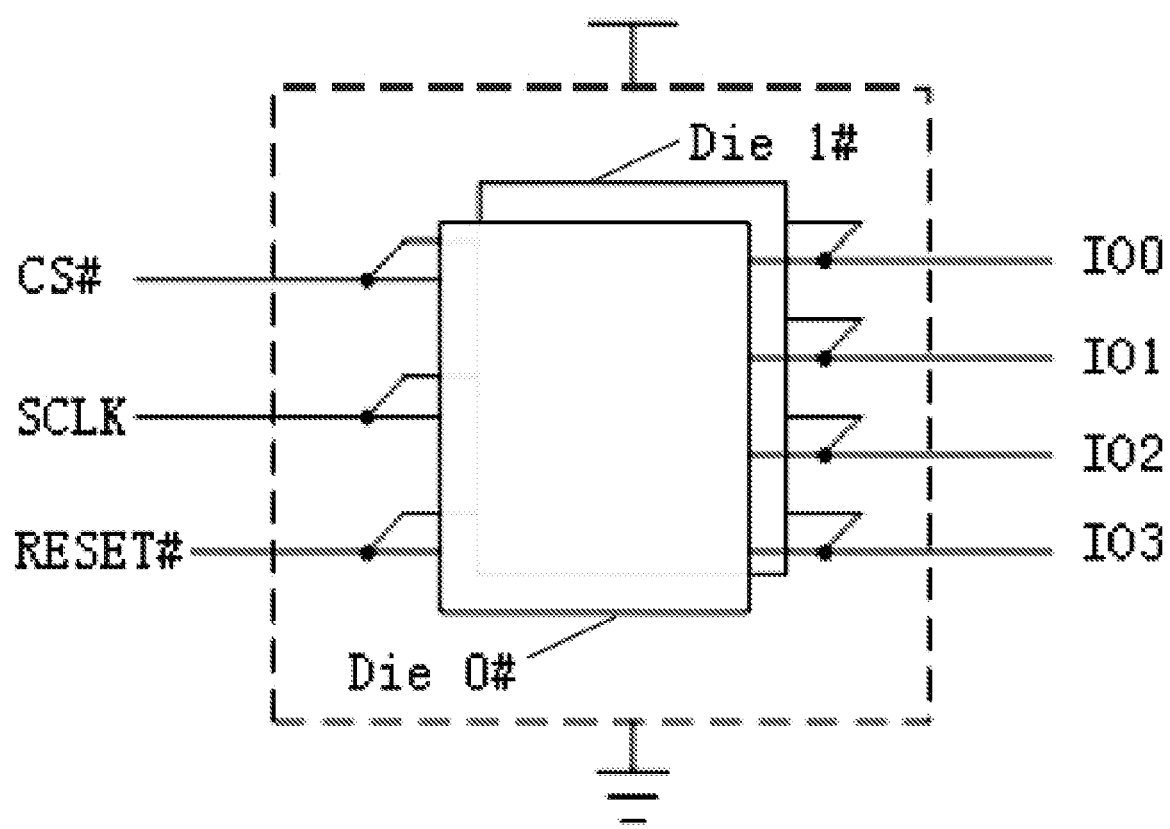
FIG. 2 is a schematic diagram of a stacked package structure of an embodiment of multiple dies using a same die selection signal.
Figure 3:
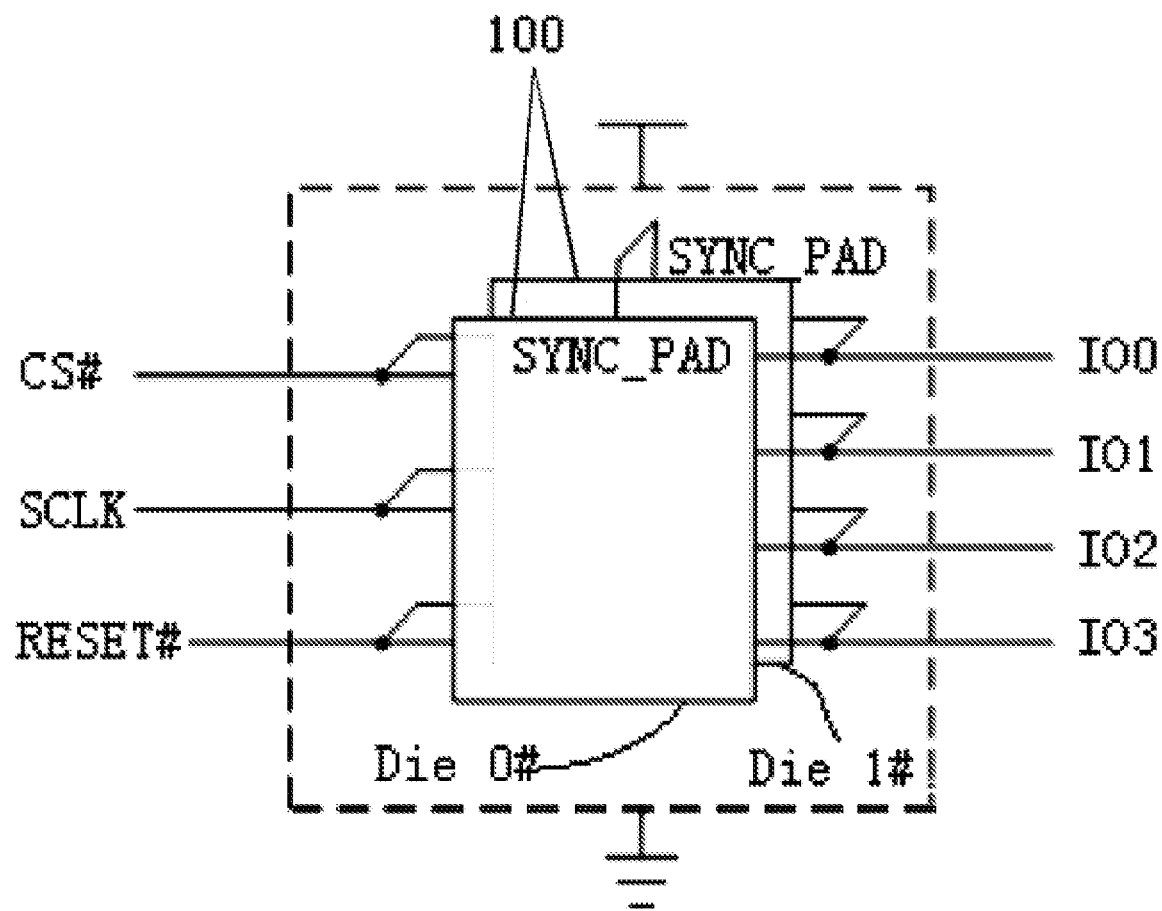
FIG. 3 is a schematic structural diagram of a multi-die stacked package memory of a preferred embodiment of the invention.

The invention provides a multi-die stacked package memory for solving the problem of output synchronization of multiple stacked and packaged dies. Particularly, as shown in FIG. 3, the FIG. 3 is a schematic structural diagram of a multi-die stacked package memory of a preferred embodiment of the invention. The multi-die stacked package memory comprises multiple dies 100, and the multiple dies 100 are stacked and packaged together to form a stacked package structure. The multiple dies 100 share a CS #pin. The CS #pin is configured to turn on or turn off the stacked package structure. The multiple dies 100 also share an IO pin. The IO pin is configured to allow the stacked package structure to output a busy status signal or an idle status signal. Each die 100 is provided with a SYNC_PAD pin.

The SYNC_PAD pins of the multiple dies 100 are electrically connected together. The SYNC_PAD pins are configured to judge whether the multiple dies 100 are all in an idle status or not. If yes, the stacked package structure is controlled to output the idle status signal through the IO pin, and if not, the stacked package structure is controlled to output the busy status signal through the IO pin.

In the above-mentioned technical solution, the SYNC_PAD pins of the multiple dies 100 are connected together to detect whether all the dies 100 have been switched from a busy status to the idle status, and the idle status is finally output till the last die 100 is switched from the busy status to the idle status.

FIG. 3 schematically shows two dies 100. For ease of description, the two dies 100 are respectively denoted as die Die 0 #and die Die 1 #. It is understood that the multi-die stacked package memory may comprise more than two dies 100 stacked and packaged together. Further, the IO pins may be plural, and in this embodiment, there are four IO pins, which are respectively denoted as pin IO1, pin IO2, pin IO3, and pin IO4.

Figure 4:
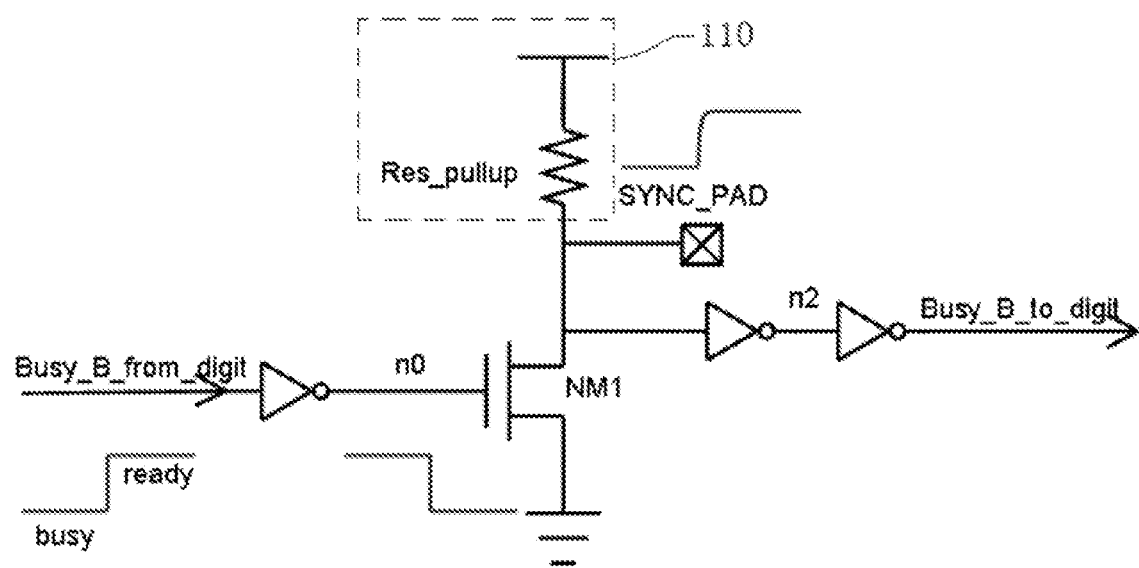
FIG. 4 is a schematic circuit diagram of dies of the multi-die stacked package memory shown in FIG. 3.

As shown in FIG. 4, the FIG. 4 is a schematic circuit diagram of the dies of the multi-die stacked package memory shown in FIG. 3. Each die 100 comprises a transistor NM1. A source electrode of the transistor NM1 is grounded. A drain electrode of the transistor NM1 is electrically connected with the SYNC_PAD pin of the die 100. The drain electrode of the transistor NM1 is also connected with a pull-up resistance circuit 110 and the IO pin. A grid electrode of the transistor NM1 of the die 100 is configured to obtain switching signals representing a working status of the die 100 and turning on or turning off the die 100 according to the working status of the die 100. The working status of the die 100 comprises the idle status or the busy status.

As shown in FIG. 3 and FIG. 4, the working principle of the multi-die stacked package memory is as follows:

Suppose that the die Die 0 #is switched from the busy status to the idle status prior to the die Die 1 #, a grid electrode or a point n0 of the die Die 0 #is switched from a high level to a low level, and the transistor NM1 of the die Die 0 #is turned off. A grid electrode or a point n0 of the die Die 1 #is still at a high level, and the transistor NM1 of the die Die 0 #is turned on. Because the SYNC_PAD pin of the die Die 0 #and the SYNC_PAD pin of the die Die 1 #are connected together, the level status of the SYNC_PAD pin of the die Die 0 #is mainly determined by the status of the transistor NM1 of the die Die 1 #. On the condition that the transistor NM1 of the die Die 1 #is turned on, the level of the SYNC_PAD pin of the die Die 0 #and the level of the SYNC_PAD pin of the die Die 1 #are both pulled down to a low level, so that the IO pin outputs the busy status signal.

When the die Die 1 #is also switched from the busy status to the idle status, the transistor NM1 of the die Die 0 #and the transistor NM1 of the die Die 1 #are both turned off. The level of the SYNC_PAD pin of the die Die 0 #and the level of the SYNC_PAD pin of the die Die 1 #are both pulled up to a high level by the pull-up resistor circuit 110. The IO pin outputs the idle status signal, indicating that the die Die 0 #and the die Die 1 #are both in the idle status.

Further, in this embodiment, the pull-up resistance circuit 110 comprises a pull-up resistor Res_pullup and a power end. The drain electrode of the transistor NM1 of the die 100 is connected with the power end through the pull-up resistor Res_pullup.

Further, the invention also provides an output synchronization method of a multi-die stacked package memory. The method comprises the following steps:

S1. providing the multi-die stacked package memory, wherein the multi-die stacked package memory comprises multiple dies 100, the multiple dies 100 are stacked and packaged together to form a stacked package structure, the multiple dies 100 share a CS #pin, the CS #pin is configured to turn on or turn off the stacked package structure, the multiple dies 100 also share an IO pin, the IO pin is configured to allow the stacked package structure to output a busy status signal or an idle status signal, and each die 100 is provided with a SYNC_PAD pin; and S2. electrically connecting the SYNC_PAD pins of the multiple dies 100 together, wherein the SYNC_PAD pins are configured to judge whether the multiple dies 100 are all in an idle status or not; if yes, controlling the stacked package structure to output the idle status signal through the IO pin; and if not, controlling the stacked package structure to output the busy status signal through the IO pin.

In the above-mentioned step S1, each die 100 comprises a transistor NM1. A source electrode of the transistor NM1 is grounded. A drain electrode of the transistor NM1 is electrically connected with the SYNC_PAD pin of the die 100. The drain electrode of the transistor NM1 is also connected with a pull-up resistance circuit 110 and the IO pin. A grid electrode of the transistor NM1 of the die 100 is configured to obtain switching signals representing a working status of the die 100 and turning on or turning off the die 100 according to the working status of the die 100. The working status of the die 100 comprises the idle status or a busy status.

Further, the pull-up resistance circuit 110 comprises a pull-up resistor Res_pullup and a power end. The drain electrode of the transistor NM1 of the die 100 is connected with the power end through the pull-up resistor Res_pullup.

The foregoing describes the embodiments of the invention with reference to the accompanying drawings. However, the invention is not limited to the foregoing specific embodiments which are merely illustrative and not restrictive. Under the teaching of the invention, several forms may be made by a person of ordinary skill in the art without departing from the purpose of the invention and the scope protected by the claim, and these forms are all within the protection scope of the invention.

What is claimed is:

1. A multi-die stacked package memory, comprising multiple dies (100), wherein the multiple dies (100) are stacked and packaged together to form a stacked package structure, the multiple dies (100) share a CS #pin, the CS #pin is configured to turn on or turn off the stacked package structure, the multiple dies (100) also share an IO pin, the IO pin is configured to allow the stacked package structure to output a busy status signal or an idle status signal, and each die (100) is provided with a SYNC_PAD pin; and the SYNC_PAD pins of the multiple dies (100) are electrically connected together, the SYNC_PAD pins are configured to judge whether the multiple dies (100) are all in an idle status or not, if yes, the stacked package structure is controlled to output the idle status signal through the IO pin, and if not, the stacked package structure is controlled to output the busy status signal through the IO pin;

wherein each die (100) comprises a transistor (NM1), a source electrode of the transistor (NM1) is grounded, a drain electrode of the transistor (NM1) is electrically connected with the SYNC_PAD pin of the die (100), the drain electrode of the transistor (NM1) is also connected with a pull-up resistance circuit (110) and the IO pin, a grid electrode of the transistor (NM1) of the die (100) is configured to obtain a switching signal representing a working status of the die (100) and turning on or turning off the die (100) according to the working status of the die (100), and the working status of the die (100) comprises the idle status or a busy status;

wherein the pull-up resistance circuit (110) comprises a pull-up resistor (Res_pullup) and a power end, and the drain electrode of the transistor (NM1) of the die (100) is connected with the power end through the pull-up resistor (Res_pullup).

2. An output synchronization method of a multi-die stacked package memory, comprising the following steps:

S1. providing a multi-die stacked package memory, wherein the multi-die stacked package memory comprises multiple dies (100), the multiple dies (100) are stacked and packaged together to form a stacked package structure, the multiple dies (100) share a CS #pin, the CS #pin is configured to turn on or turn off the stacked package structure, the multiple dies (100) also share an IO pin, the IO pin is configured to allow the stacked package structure to output a busy status signal or an idle status signal, and each die (100) is provided with a SYNC_PAD pin; and S2. electrically connecting the SYNC_PAD pins of the multiple dies (100) together, wherein the SYNC_PAD pins are configured to judge whether the multiple dies (100) are all in an idle status or not; if yes, controlling the stacked package structure to output the idle status signal through the IO pin; and if not, controlling the stacked package structure to output the busy status signal through the IO pin;

wherein in the step S1, each e die (100) comprises a transistor (NM1), a source electrode of the transistor (NM1) is grounded, a drain electrode of the transistor (NM1) is electrically connected with the SYNC_PAD pin of the die (100), the drain electrode of the transistor (NM1) is also connected with a pull-up resistance circuit (110) and the IO pin, a grid electrode of the transistor (NM1) of the die (100) is configured to obtain a switching signal representing a working status of the die (100) and turning on or turning off the die (100) according to the working status of the die (100), and the working status of the die (100) comprises the idle status or a busy status.

3. The output synchronization method according to claim 2, wherein the pull-up resistance circuit (110) comprises a pull-up resistor (Res_pullup) and a power end, and the drain electrode of the transistor (NM1) of the die (100) is connected with the power end through the pull-up resistor (Res_pullup).

\* \* \* \* \*